(12) United States Patent
Zhang et al.

(10) Patent No.: US 11,043,168 B2
(45) Date of Patent: Jun. 22, 2021

(54) SHIFT REGISTER AND METHOD FOR DRIVING THE SAME, GATE DRIVING CIRCUIT AND DISPLAY APPARATUS

(71) Applicants: CHENGDU BOE OPTOELECTRONICS TECHNOLOGY CO., LTD., Chengdu (CN); BOE TECHNOLOGY GROUP CO., LTD., Beijing (CN)

(72) Inventors: Yi Zhang, Beijing (CN); Kai Zhang, Beijing (CN); Ming Hu, Beijing (CN)

(73) Assignees: CHENGDU BOE OPTOELECTRONICS TECHNOLOGY CO., LTD., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 22 days.

(21) Appl. No.: 16/398,850

(22) Filed: Apr. 30, 2019

(65) Prior Publication Data

US 2020/0066209 A1    Feb. 27, 2020

(30) Foreign Application Priority Data

Aug. 24, 2018 (CN) .......................... 201810978349.0

(51) Int. Cl.
*G11C 19/00* (2006.01)
*G09G 3/3266* (2016.01)
(Continued)

(52) U.S. Cl.
CPC ............ *G09G 3/3266* (2013.01); *G09G 3/20* (2013.01); *G09G 3/3677* (2013.01); *G11C 19/28* (2013.01);
(Continued)

(58) Field of Classification Search
None
See application file for complete search history.

(56) References Cited

U.S. PATENT DOCUMENTS 9,336,900 B2   5/2016   Wang et al.
9,786,228 B2   10/2017  Ma
(Continued)

FOREIGN PATENT DOCUMENTS

CN   104008779 A   8/2014
CN   104835450 A   8/2015
(Continued)

OTHER PUBLICATIONS

First Chinese Office Action dated Feb. 6, 2020, for corresponding Chinese Application No. 201810978349.0, 23 pages.

*Primary Examiner* — Tuan T Lam
(74) *Attorney, Agent, or Firm* — Kinney & Lange, P.A.

(57) ABSTRACT

A shift register and a method for driving the same, a gate driving circuit and a display apparatus are disclosed. The shift register includes: an input circuit configured to transmit an input signal from an input terminal to a first node; a first node control circuit configured to transmit a first voltage signal from a first voltage signal terminal to the first node; a second node control circuit configured to transmit a first clock signal from a first clock signal terminal to a second node; a third node control circuit configured to transmit a second voltage signal from a second voltage signal terminal to a third node; and an output circuit configured to transmit one of the first voltage signal from the first voltage signal terminal or the second voltage signal from the second voltage signal terminal to an output terminal.

8 Claims, 8 Drawing Sheets

(51) Int. Cl.
*G11C 19/28* (2006.01)
*G09G 3/36* (2006.01)
*G09G 3/20* (2006.01)

(52) U.S. Cl.
CPC ... *G11C 19/287* (2013.01); *G09G 2310/0286* (2013.01); *G09G 2320/0626* (2013.01)

(56) References Cited

U.S. PATENT DOCUMENTS

| | | | |
|---|---|---|---|
| 9,799,272 B2 | 10/2017 | Zhang et al. | |
| 9,881,543 B2 | 1/2018 | Ma | |
| 10,026,496 B2 | 7/2018 | Ma | |
| 10,102,919 B2 | 10/2018 | Ma | |
| 10,572,038 B2* | 2/2020 | Gu | G11C 19/287 |
| 2014/0055444 A1* | 2/2014 | Jang | G09G 3/3291 345/213 |
| 2014/0375616 A1* | 12/2014 | Kim | G09G 3/3266 345/211 |
| 2015/0348646 A1 | 12/2015 | Wang et al. | |
| 2016/0217870 A1* | 7/2016 | Tseng | G11C 19/28 |
| 2017/0004771 A1* | 1/2017 | Lee | G09G 3/20 |
| 2017/0004775 A1* | 1/2017 | Chen | G09G 3/3266 |
| 2017/0004801 A1* | 1/2017 | Li | G11C 19/28 |
| 2017/0116920 A1* | 4/2017 | Kwon | G09G 3/3266 |
| 2017/0186360 A1 | 6/2017 | Ma | |
| 2017/0200418 A1* | 7/2017 | Zhang | G11C 19/287 |
| 2017/0200419 A1 | 7/2017 | Ma | |
| 2017/0287413 A1* | 10/2017 | Li | G09G 3/3426 |
| 2017/0301407 A1 | 10/2017 | Ma | |
| 2017/0365211 A1* | 12/2017 | Lee | G09G 3/3233 |
| 2018/0130406 A1* | 5/2018 | Xiang | G11C 19/28 |
| 2018/0188578 A1* | 7/2018 | Wang | G02F 1/13306 |
| 2018/0211716 A1* | 7/2018 | Ma | G09G 3/20 |
| 2019/0304375 A1* | 10/2019 | Kim | G09G 3/3258 |
| 2019/0340975 A1* | 11/2019 | Zhai | G09G 3/3266 |
| 2019/0347997 A1* | 11/2019 | Park | G09G 3/3233 |

FOREIGN PATENT DOCUMENTS

| | | |
|---|---|---|
| CN | 104900189 A | 9/2015 |
| CN | 104900268 A | 9/2015 |
| CN | 105047124 A | 11/2015 |
| CN | 105096808 A | 11/2015 |
| CN | 105185287 A | 12/2015 |
| CN | 205047873 U | 2/2016 |
| CN | 105609041 A | 5/2016 |
| CN | 106782399 A | 5/2017 |
| CN | 106847143 A | 6/2017 |

* cited by examiner

SHIFT REGISTER AND METHOD FOR DRIVING THE SAME, GATE DRIVING CIRCUIT AND DISPLAY APPARATUS

CROSS-REFERENCE TO RELATED APPLICATION(S)

This application claims priority to the Chinese Patent Application No. 201810978349.0, filed on Aug. 24, 2018, which is incorporated herein by reference in its entirety.

TECHNICAL FIELD

The present disclosure relates to the field of display technology, and more particularly, to a shift register and a method for driving the same, a gate driving circuit, and a display apparatus.

BACKGROUND

In display technology, cascaded shift register units are used to generate driving signals to drive an array of pixel units on a display panel. With the advancement of display technology, for example, Organic Light Emitting Diodes (OLEDs) have been widely used in the display field, and have characteristics such as active illumination, lightweight and portability, large viewing angle, wide color gamut, etc. Therefore, higher requirements are proposed for display driving.

SUMMARY

According to some embodiments of the present disclosure, there are provided a shift register and a method for driving the same, a gate driving circuit, and a display apparatus.

According to an aspect of the embodiments of the present disclosure, there is provided a shift register, comprising:

an input circuit coupled to a first clock signal terminal, an input terminal, and a first node, and configured to transmit an input signal from the input terminal to the first node under control of a first clock signal from the first clock signal terminal;

a first node control circuit coupled to the first node, a second clock signal terminal, a first voltage signal terminal, and a second node, and configured to transmit a first voltage signal from the first voltage signal terminal to the first node under control of a potential at the second node and a second clock signal from the second clock signal terminal;

a second node control circuit coupled to the first clock signal terminal, the first node, and the second node, and configured to transmit the first clock signal from the first clock signal terminal to the second node under control of a potential at the first node;

a third node control circuit coupled to the second node, the first clock signal terminal, the second clock signal terminal, a second voltage signal terminal, and a third node, and configured to transmit the second voltage signal from the second voltage signal terminal to the third node under control of the first clock signal from the first clock signal terminal, the second clock signal from the second clock signal terminal, and the potential at the second node; and an output circuit coupled to the first node, the third node, the first voltage signal terminal, the second voltage signal terminal, the second clock signal terminal, and an output terminal, and configured to transmit the first voltage signal from the first voltage signal terminal or the second voltage signal from the second voltage signal terminal to the output terminal under control of the potential at the first node, a potential at the third node, and the second clock signal from the second clock signal terminal.

In an example, the shift register further comprises: a de-noising circuit coupled to at least one of the first node, the second node, or the output terminal, and configured to reduce noise at the at least one of the first node, the second node, or the output terminal, which is coupled to the de-noising circuit.

In an example, the third node control circuit comprises:

a fifth transistor having a control terminal coupled to the first clock signal terminal, a first terminal coupled to the second voltage signal terminal, and a second terminal coupled to the second node;

a sixth transistor having a control terminal coupled to the second node, a first terminal coupled to the second voltage signal terminal, and a second terminal coupled to a first terminal of a seventh transistor;

the seventh transistor having a control terminal coupled to the second clock signal terminal, the first terminal coupled to the second terminal of the sixth transistor, and a second terminal coupled to the third node; and a second capacitor having a first terminal coupled to the second clock signal terminal and a second terminal coupled to the second node.

In an example, the de-noising circuit comprises:

an eleventh transistor through which the control terminal of the sixth transistor and the second terminal of the second capacitor are coupled to the second node, wherein the eleventh transistor has a control terminal coupled to the second voltage signal terminal, a first terminal coupled to the second node, and a second terminal coupled to the control terminal of the sixth transistor and the second terminal of the second capacitor.

In an example, the output circuit comprises:

a first output sub-circuit coupled to the first node, the third node, the first voltage signal terminal, and the output terminal, and configured to transmit the first voltage signal from the first voltage signal terminal to the output terminal under control of the potential at the first node and the potential at the third node; and a second output sub-circuit coupled to the first node, the second voltage signal terminal, the second clock signal terminal, and the output terminal, and configured to transmit the second voltage signal from the second voltage signal terminal to the output terminal under control of the potential at the first node and the second clock signal from the second clock signal terminal.

In an example, the first output sub-circuit comprises:

an eighth transistor having a control terminal coupled to the first node, a first terminal coupled to the first voltage signal terminal, and a second terminal coupled to the third node;

a ninth transistor having a control terminal coupled to the third node, a first terminal coupled to the first voltage signal terminal, and a second terminal coupled to the output terminal; and a third capacitor having a first terminal coupled to the first voltage signal terminal and a second terminal coupled to the third node.

In an example, the de-noising circuit comprises:

a thirteenth transistor through which the second terminal of the ninth transistor is coupled to the output terminal, wherein the thirteenth transistor has a control terminal coupled to the second voltage signal terminal, a first terminal coupled to the second terminal of the ninth transistor, and a second terminal coupled to the output terminal.

In an example, the second output sub-circuit comprises:

a tenth transistor having a control terminal coupled to the first node, a first terminal coupled to the second voltage signal terminal, and a second terminal coupled to the output terminal; and a first capacitor having a first terminal coupled to the first node, and a second terminal coupled to the second clock signal terminal.

In an example, the de-noising circuit comprises:

a twelfth transistor through which the first terminal of the first capacitor and the control terminal of the tenth transistor are coupled to the first node, wherein the twelfth transistor has a control terminal coupled to the second voltage signal terminal, a first terminal coupled to the first node, and a second terminal coupled to the first terminal of the first capacitor and the control terminal of the tenth transistor.

In an example, the first node control circuit comprises:

a second transistor having a control terminal coupled to the second node, a first terminal coupled to the first voltage signal terminal, and a second terminal coupled to a first terminal of a third transistor; and the third transistor having a control terminal coupled to the second clock signal terminal, the first terminal coupled to the second terminal of the second transistor, and a second terminal coupled to the first node.

In an example, the second node control circuit comprises:

a fourth transistor having a control terminal coupled to the first node, a first terminal coupled to the first clock signal terminal, and a second terminal coupled to the second node.

In an example, the input circuit comprises:

a first transistor having a control terminal coupled to the first clock signal terminal, a first terminal coupled to the input terminal, and a second terminal coupled to the first node.

In an example, the transistors in the shift register are all P-type transistors, the first voltage signal is a high level signal and the second voltage signal is low level signal.

According to another aspect of the embodiments of the present disclosure, there is provided a gate driving circuit, comprising a plurality of cascaded shift registers described above.

According to yet another aspect of the embodiments of the present disclosure, there is provided a display apparatus, comprising the gate driving circuit described above.

According to a further aspect of the embodiments of the present disclosure, there is provided a method for driving the shift register described above, comprising:

in a preparation phase, inputting a low level to the input terminal, inputting one of a low level or a high level to the first clock signal terminal, and inputting the other of the low level or the high level to the second clock signal terminal, so that the output terminal outputs a low level;

in a first phase, inputting a high level to the input terminal, inputting a low level to the first clock signal terminal, and inputting a high level to the second clock signal terminal, so that the output terminal outputs a low level;

in a second phase, inputting a high level to the input terminal, inputting one of a low level or a high level to the first clock signal terminal, and inputting the other of the low level or the high level to the second clock signal terminal, so that the output terminal outputs a high level;

in a third phase, inputting a low level to the input terminal, inputting a high level to the first clock signal terminal, and inputting a low level to the second clock signal terminal, so that the output terminal outputs a high level; and in a fourth phase, inputting a low level to the input terminal, inputting a high level to the first clock signal terminal, and inputting a low level to the second clock signal terminal, so that the output terminal outputs a low level.

BRIEF DESCRIPTION OF THE DRAWINGS

The above and other purposes, features and advantages of the present disclosure will become more apparent from the following embodiments of the present disclosure in conjunction with accompanying drawing, in which.

DETAILED DESCRIPTION

Some of the embodiments of the present disclosure will be described in detail below with reference to the accompanying drawings, in which details and functions which are not necessary for the present disclosure are omitted in the description in order to prevent confusion in the understanding of the present disclosure. In the present specification, the following description of various embodiments for describing the principles of the present disclosure is illustrative only and should not be construed as limiting the scope of the disclosure in any way. The following description of the drawings, with reference to the accompanying drawings, is provided to assist in a comprehensive understanding of the example embodiments of the disclosure as defined by the claims and their equivalents. The following description includes many specific details to assist in the understanding, but such details are to be regarded as merely exemplary. Accordingly, those of ordinary skill in the art will recognize that numerous changes and modifications can be made to the embodiments described herein without departing from the scope and spirit of the present disclosure. In addition, descriptions of well-known functions and structures are omitted for clarity and conciseness. In addition, the same reference numerals are used for the same or similar functions, devices and operations throughout the accompanying drawings. Further, in the accompanying drawings, various parts are not necessarily drawn to scale. In other words, relative sizes, lengths etc. of various parts in the accompanying drawings may not necessarily be drawn by actual proportions.

In the present disclosure, the terms "comprising" and "including" and their derivatives are intended to be inclusive instead of being limiting, and the term "or" may be inclusive, which means "and/or".

Hereinafter, description is made in detail by taking the embodiments of the present disclosure being applied to a gate driving circuit of a display apparatus as an example. However, it should be understood by those skilled in the art that the application field of the present disclosure is not limited thereto. In fact, a shift register according to the embodiments of the present disclosure etc. may be applied to other fields in which a shift register is required to be used.

Further, although the description has been made below by taking transistors being P-type transistors as an example, the present disclosure is not limited thereto. In fact, it may be understood by those skilled in the art that when one or more of the following transistors are N-type transistors, the technical solutions according to the present application may also be implemented, as long as only level setting/coupling relationship is appropriately adjusted.

Figure 1:
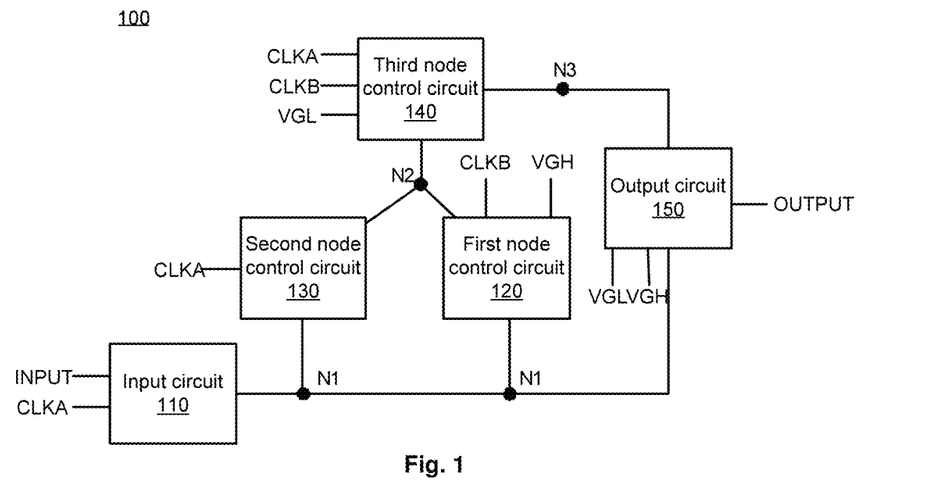
FIG. 1 is a schematic block diagram illustrating a shift register according to an embodiment of the present disclosure.

FIG. 1 is a schematic block diagram illustrating a shift register 100 according to an embodiment of the present disclosure.

As shown in FIG. 1, the shift register 100 may comprise an input circuit 110, a first node control circuit 120, a second node control circuit 130, a third node control circuit 140, and an output circuit 150.

As shown in FIG. 1, the input circuit 110 may be coupled to a first clock signal terminal CLKA, an input terminal INPUT, and a first node N1, and may be configured to transmit an input signal from the input terminal INPUT to the first node N1 under control of a first clock signal from the first clock signal terminal CLKA. In addition, as shown in FIG. 1, the first node control circuit 120 may be coupled to the first node N1, a second clock signal terminal CLKB, a first voltage signal terminal VGH, and a second node N2, and may be configured to transmit a first voltage signal from the first voltage signal terminal VGH to the first node N1 under control of a potential at the second node N2 and a second clock signal from the second clock signal terminal CLKB. In addition, as shown in FIG. 1, the second node control circuit 130 may be coupled to the first clock signal terminal CLKA, the first node N1, and the second node N2, and may be configured to transmit the first clock signal from the first clock signal terminal CLKA to the second node N2 under control of a potential at the first node N1. In addition, as shown in FIG. 1, the third node control circuit 140 may be coupled to the second node N2, the first clock signal terminal CLKA, the second clock signal terminal CLKB, a second voltage signal terminal VGL, and a third node N3, and may be configured to transmit a second voltage signal from the second voltage signal terminal VGL to the third node N3 under control of the first clock signal from the first clock signal terminal CLKA, the second clock signal from the second clock signal terminal CLKB, and the potential at the second node N2. In addition, as shown in FIG. 1, the output circuit 150 may be coupled to the first node N1, the third node N3, the second clock signal terminal CLKB, the first voltage signal terminal VGH, the second voltage signal terminal VGL, and an output terminal OUTPUT, and may be configured to transmit one of the first voltage signal from the first voltage signal terminal VGH or the second voltage signal from the second voltage signal terminal VGL to the output terminal OUTPUT under control of the potential at the first node N1, a potential at the third node N3, and the second clock signal from the second clock signal terminal CLKB.

It should be illustrated that resistance of conductive lines between the respective circuits is negligible, and thus each node may be considered as any point on a respective conductive line. For example, two nodes N1 shown in FIG. 1 are equivalent. Therefore, actual circuits may not be connected in the specific manner shown in FIG. 1, but only need to have an equivalent topology.

Figure 2:
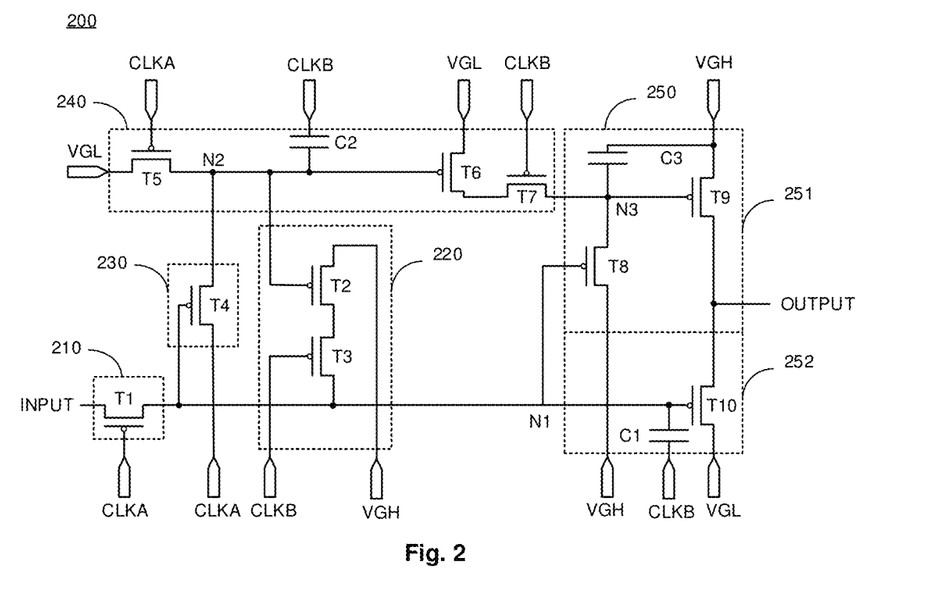
FIG. 2 is an exemplary circuit diagram illustrating a shift register according to an embodiment of the present disclosure.

FIG. 2 is an exemplary circuit diagram illustrating a shift register 200 according to an embodiment of the present disclosure.

Similarly to the shift register 100 shown in FIG. 1, the shift register 200 may comprise an input circuit 210, a first node control circuit 220, a second node control circuit 230, a third node control circuit 240, and an output circuit 250. However, the present disclosure is not limited thereto. In fact, it is possible to implement omission of one or more of these circuits, or addition of other circuits, or modification of individual circuits, or any combination thereof, which fall within the protection scope of the present disclosure.

As shown in FIG. 2, the input circuit 210 may comprise a first transistor T1 having a control terminal coupled to a first clock signal terminal CLKA, a first terminal coupled to an input terminal INPUT, and a second terminal coupled to a first node N1. It should be illustrated that in the context of the present disclosure, unless otherwise stated, the term "control terminal" is generally used to refer to a gate or a base of a transistor, etc.; the terms "first terminal" and "second terminal" of a transistor may refer to a source and a drain of the transistor respectively, or vice versa, or may refer to a collector and an emitter of the transistor respectively, or vice versa; and the terms "first terminal" and "second terminal" of a capacitor may refer to two electrodes of the capacitor respectively.

The first node control circuit 220 may comprise: a second transistor T2 having a control terminal coupled to a second node N2, a first terminal coupled to a first voltage signal terminal VGH, and a second terminal coupled to a first terminal of a third transistor T3; and the third transistor T3 having a control terminal coupled to a second clock signal terminal CLKB, the first terminal coupled to the second terminal of the second transistor T2, and a second terminal coupled to the first node N1.

The second node control circuit 230 may comprise a fourth transistor T4 having a control terminal coupled to the first node N1, a first terminal coupled to the first clock signal terminal CLKA, and a second terminal coupled to the second node N2.

The third node control circuit 240 may comprise: a fifth transistor T5 having a control terminal coupled to the first clock signal terminal CLKA, a first terminal coupled to a second voltage signal terminal VGL, and a second terminal coupled to the second node N2; a sixth transistor T6 having a control terminal coupled to the second node N2, a first terminal coupled to the second voltage signal terminal VGL, and a second terminal coupled to a first terminal of a seventh transistor T7; the seventh transistor T7 having a control terminal coupled to the second clock signal terminal CLKB, the first terminal coupled to the second terminal of the sixth transistor T6, and a second terminal coupled to a third node N3; and a second capacitor C2 having a first terminal coupled to the second clock signal terminal CLKB, and a second terminal coupled to the second node N2.

The output circuit 250 may comprise a first output sub-circuit 251 and a second output sub-circuit 252. The first output sub-circuit 251 is coupled to the first node N1, the third node N3, the first voltage signal terminal VGH, and an output terminal OUTPUT, and is configured to output a first voltage signal from the first voltage signal terminal VGH to the output terminal OUTPUT under control of the first node N1 and the third node N3. The second output sub-circuit 252 is coupled to the first node N1, the second voltage signal terminal VGL, the second clock signal terminal CLKB, and the output terminal OUTPUT, and is configured to transmit a second voltage signal from the second signal terminal VGL to the output terminal OUTPUT under control of the first node N1.

In FIG. 2, the first output sub-circuit 251 may comprise: an eighth transistor T8 having a control terminal coupled to the first node N1, a first terminal coupled to the first voltage signal terminal VGH, and a second terminal coupled to the third node N3; a ninth transistor T9 having a control terminal coupled to the third node N3, a first terminal coupled to the first voltage signal terminal VGH, and a second terminal coupled to the output terminal OUTPUT; and a third capacitor C3 having a first terminal coupled to the first voltage signal terminal VGH, and a second terminal coupled to the third node N3.

In FIG. 2, the second output sub-circuit 252 may comprise: a tenth transistor T10 having a control terminal coupled to the first node N1, a first terminal coupled to the second voltage signal terminal VGL, and a second terminal coupled to the output terminal OUTPUT; and a first capacitor C1 having a first terminal coupled to the first node N1 and a second terminal coupled to the second clock signal terminal CLKB.

In the embodiment shown in FIG. 2, if the transistors in the shift register 200 are all P-type transistors, the first voltage signal from the first voltage signal terminal VGH may be a high level signal and the second voltage signal from the second voltage signal terminal VGL may be a low level signal. However, the present disclosure is not limited thereto. If the transistors in the shift register 200 are all N-type transistors, the first voltage signal from the first voltage signal terminal VGH may be a low level signal, and the second voltage signal from the second voltage signal terminal VGL may be a high level signal.

Figure 3:
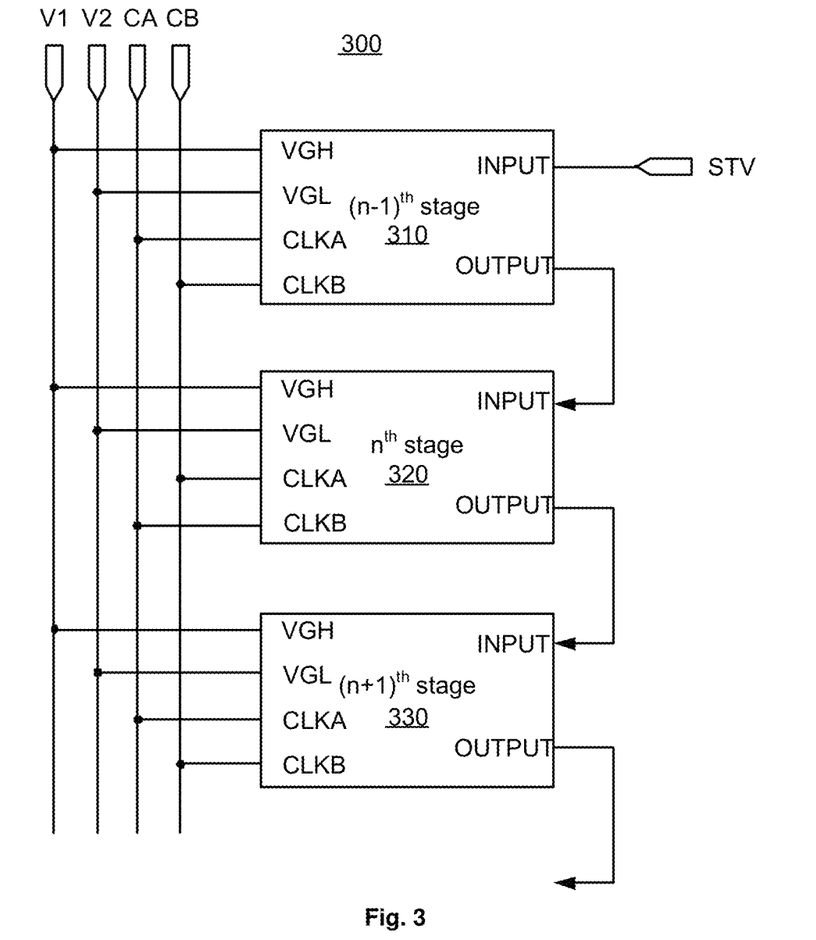
FIG. 3 is a schematic block diagram illustrating a gate driving circuit according to an embodiment of the present disclosure.

Next, a schematic diagram of an exemplary configuration of a gate driving circuit according to an embodiment of the present disclosure will be described with reference to FIG. 3. FIG. 3 is a schematic diagram illustrating an exemplary configuration of a gate driving circuit 300 according to an embodiment of the present disclosure. The gate driving circuit 300 may comprise a plurality of cascaded shift registers 310, 320, 330, etc. Although only three shift registers are shown in the embodiment shown in FIG. 3, the embodiments of the present disclosure are not limited thereto, and any number of shift registers may be used. In some embodiments, each of the shift registers shown in FIG. 3 may be the shift register 100 as shown in FIG. 1, the shift register 200 shown in FIG. 2, etc., but the present disclosure is not limited thereto. In some other embodiments, in the gate driving circuit 300 shown in FIG. 3, the shift register 100 and/or 200 according to the embodiment of the present disclosure may also be used as one part of the gate driving circuit 300, and other shift registers may be used as the other part of the gate driving circuit 300.

As shown in FIG. 3, each shift register (for example, an $n^{th}$ stage of shift register 320) has an input terminal INPUT(n) coupled to an output terminal OUTPUT(n−1) of a previous stage of shift register (for example, an $(n-1)^{th}$ stage of shift register 310), and an output terminal OUTPUT(n) coupled to an input terminal INPUT(n+1) of a next stage of shift register (for example, an $(n+1)^{th}$ stage of shift register 330). In addition, an input terminal INPUT of a first stage of shift register may, for example, be coupled to a StarT Vertical (STV) signal line to receive an STV signal indicating the start of scanning of a frame of picture, for example, as shown in the $(n-1)^{th}$ stage of shift register 310.

In addition, as shown in FIG. 3, clock signal terminals CLKA and CLKB of two adjacent shift registers (for example, the $n^{th}$ stage of shift register 320 and the $(n-1)^{th}$ stage of shift register 310 or the $(n+1)^{th}$ stage of shift register 330) may be coupled to a first clock signal CA and a second clock signal CB respectively in different orders. For example, a first clock signal terminal CLKA of the $(n-1)^{th}$ stage of shift register 310 may be coupled to receive the first clock signal CA, and a second clock signal terminal CLKB of the $(n-1)^{th}$ stage of shift register 310 may be coupled to receive the second clock signal CB; and a first clock signal terminal CLKA of the $n^{th}$ stage of shift register 320 may be coupled to receive the second clock signal CB, and a second clock signal terminal CLKB of the $n^{th}$ stage of shift register 320 may be coupled to receive the first clock signal CA, and so on. In other words, in the embodiment shown in FIG. 3, CLKA and CLKB of the adjacent shift registers are coupled to the respective clock signal lines in opposite connection orders.

Figure 4A:
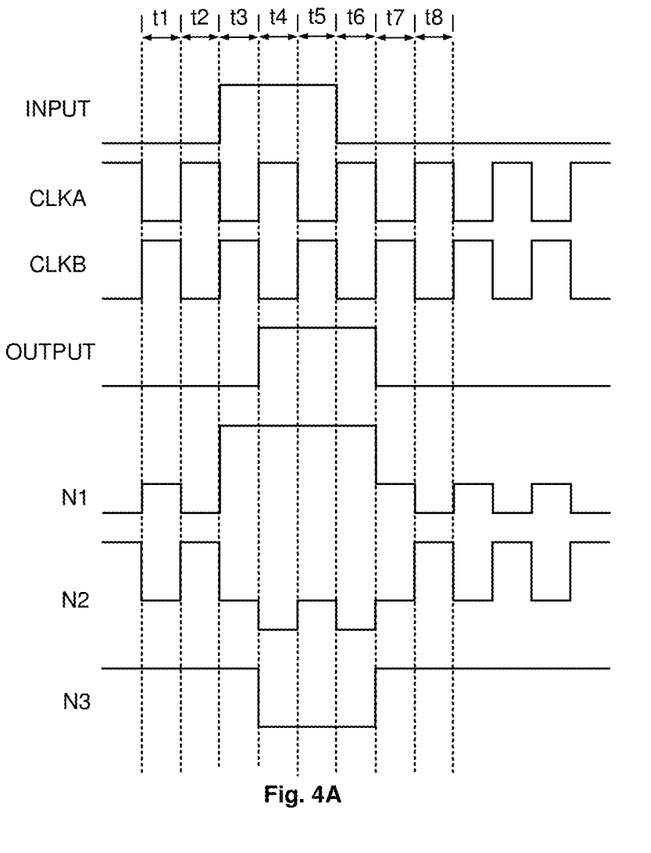
FIG. 4A is a signal timing diagram of the shift register shown in FIG. 2.

In some embodiments, the first clock signal CA and the second clock signal CB may be inverted with each other, for example, waveforms of the first clock signal CA and the second clock signal CB are different by, for example, a half of a clock period (and are different by a phase of nπ), thereby achieving an operational timing as shown in FIG. 4 below. In addition, also as shown in FIG. 3, a first voltage signal terminal VGH and a second voltage signal terminal VGL of each shift register may be coupled to receive a first voltage signal V1 and a second voltage signal V2 respectively.

Figure 4B:
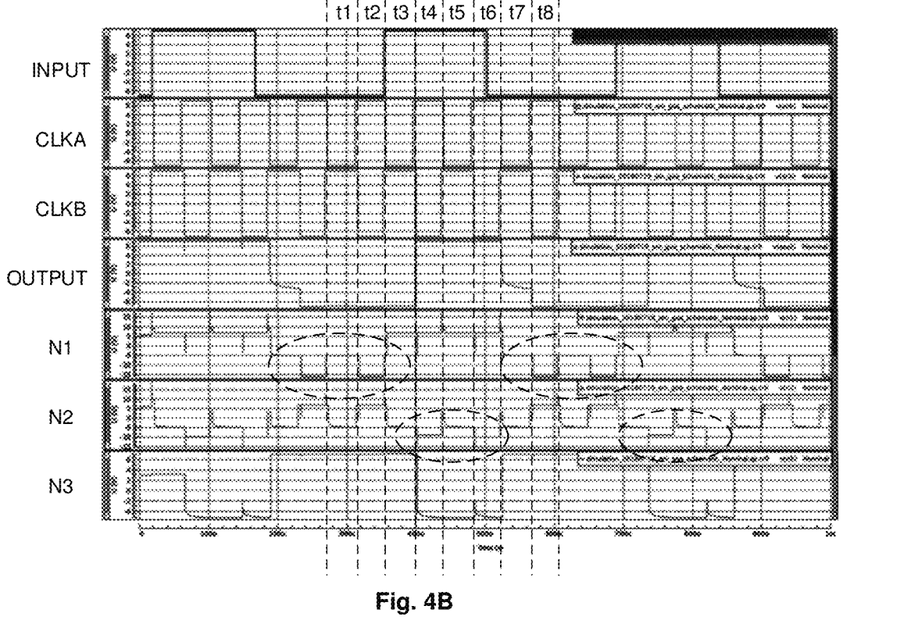
FIG. 4B is a waveform diagram illustrating simulation signals of the shift register shown in FIG. 2.

The operational timing of the shift register according to the embodiment of the present disclosure will be described in detail below with reference to FIGS. 1 to 3 in conjunction with FIGS. 4A and 4B (hereinafter collectively referred to as FIG. 4). FIG. 4A is a signal timing diagram of the shift register shown in FIG. 2. FIG. 4B is a waveform diagram illustrating simulation signals of the shift register shown in FIG. 2.

As shown in FIG. 4, in a period t1, the first clock signal terminal CLKA is at a low level, the first transistor T1 is turned on, and therefore a low level input signal at the input terminal INPUT is transmitted to the first node N1. Thereby, the tenth transistor T10 is turned on, so that the output terminal OUTPUT finally outputs a low level from the second voltage signal terminal VGL. In addition, since the first clock signal terminal CLKA is at a low level, the transistor T5 is turned on, and the low level at the second voltage signal terminal VGL is transmitted to the second node N2, so that the transistor T6 is turned on. Since the first node N1 is at a low level, the eighth transistor T8 is turned on, and a high level signal at the first voltage signal terminal VGH is transmitted to the third node N3, so that the ninth transistor T9 is turned off. Further, since the second clock signal terminal CLKB is at a high level, the seventh transistor T7 is turned off.

In a period t2, the first clock signal terminal CLKA is at a low level, and the first transistor T1 and the fifth transistor T5 are turned off. The second clock signal terminal CLKB is at a low level, the level at the first node N1 becomes lower under the bootstrap action of the first capacitor C1, and the tenth transistor T10 is completely turned on, so that the output terminal OUTPUT continuously outputs a low level signal from the second voltage signal terminal VGL. In addition, again since the first node N1 is still at a low level, a high level at first voltage signal terminal VGH is transmitted to the third node N3 through the eighth transistor T8, and the ninth transistor T9 is turned off. In addition, again since the first node N1 is still at a low level, the fourth transistor T4 is turned on. At this time, the first clock signal terminal CLKA is at a high level, and therefore the second node N2 is at a high level, so that the sixth transistor T6 is turned off.

In a period t3, the first clock signal terminal CLKA is at a low level, the first transistor T1 is turned on, and a high level at the input terminal INPUT is transmitted to the first node N1, so that the tenth transistor T10 is turned off. Further, since the second clock signal terminal CLKB is at a high level, the seventh transistor T7 is turned off, the third node N3 is maintained at a high level due to the presence of the capacitor C3, and the transistor T9 is maintained to be turned off. The output terminal OUTPUT is maintained at a low level as before due to the presence of a display load. Further, since the first clock signal terminal CLKA is at a low level, the fifth transistor T5 is turned on, so that the low level signal from the second voltage signal terminal VGL is transmitted to the second node N2.

In a period t4, the first clock signal terminal CLKA is at a high level, so that the first transistor T1 and the fifth transistor T5 are turned off. The second clock signal terminal CLKB is at a low level, and the second node N2 becomes a lower level under the bootstrap action of the second capacitor C2. The second node N2 is at a low level, so that the sixth transistor T6 is turned on. The second clock signal terminal CLKB is at a low level, so that the seventh transistor T7 is turned on, and thereby the low level at the second voltage signal terminal VGL is transmitted to the third node N3. The third node N3 is at a low level, so that the ninth transistor T9 is turned on, and thereby a high level (first voltage signal V1) from the first voltage signal terminal VGH is finally transmitted to the output terminal OUTPUT. In addition, the second node N2 is at a low level, so that the second transistor T2 is turned on, and the second clock signal terminal CLKB is at a low level, so that the transistor T3 is turned on. Thereby, the high level at the first voltage signal terminal VGH is transmitted to the first node N1, so that the fourth transistor T4, the eighth transistor T8, and the tenth transistor T10 are turned off.

In a period t5, the first clock signal terminal CLKA is at a low level, and the first transistor T1 is turned on, so that the high level at the input terminal INPUT is transmitted to the first node N1, so that the eighth transistor T8 and the tenth transistor T10 are still turned off. Further, since the second clock signal terminal CLKB is at a high level, the seventh transistor T7 is turned off, and the third node N3 is maintained at the low level through the third capacitor C3. Thereby, the ninth transistor T9 is still turned on. Therefore, the high level first voltage signal from the first voltage signal terminal VGH is transmitted through the ninth transistor T9, so that the output terminal OUTPUT outputs a high level signal. Further, since the first clock signal terminal CLKA is at a low level, the fifth transistor T5 is turned on, and thereby the low level second voltage signal from the second voltage signal terminal VGL is transmitted to the second node N2.

In a period t6, the first clock signal terminal CLKA is at a high level, so that the first transistor T1 and the fifth transistor T5 are turned off. Since the second clock signal CLKB becomes a low level, the second node N2 becomes a lower level under the bootstrap action of the second capacitor C2. Since the second node N2 is at a low level and the second clock signal terminal CLKB is at a low level, the high level at the first voltage signal terminal VGH is transmitted to the first node N1 through the second transistor T2 and the third transistor T3, so that the tenth transistor T10 is turned off. In addition, the second node N2 is at a low level, so that the sixth transistor T6 is turned on, and the second clock signal terminal CLKB is at a low level, so that the seventh transistor T7 is turned on. Thereby, the low level at the second voltage signal terminal VGL is transmitted to the third node N3. The third node N3 is at a low level, so that the ninth transistor T9 is still turned on, and the high level first voltage signal at the first voltage signal terminal VGH is transmitted to the output terminal OUTPUT through the ninth transistor T9.

In a period t7, the first clock signal terminal CLKA is at a low level, and the first transistor T1 is turned on, so that the low level at the input terminal INPUT is transmitted to the first node N1. The first node N1 is at a low level, so that the tenth transistor T10 is turned on, and the low level second voltage signal at the second voltage signal terminal VGL is transmitted to the output terminal OUTPUT through the tenth transistor T10. Further, the first node N1 is at a low level, so that the eighth transistor T8 is also turned on, and the high level at the first voltage signal terminal VGH is transmitted to the third node N3 through the eighth transistor T8, and thereby the ninth transistor T9 is turned off. Further, since the first clock signal terminal CLKA is at a low level, a low level of the second voltage signal terminal VGL is transmitted to the second node N2 through the fifth transistor T5.

In a period t8, the first clock signal terminal CLKA is at a high level, and the first transistor T1 is turned off. The second clock signal CLKB changes from a high level to a low level, and the first node N1 becomes a lower level under the bootstrap action of the first capacitor C1. The first node N1 is at a low level, so that the fourth transistor T4 is turned on, and thereby the high level signal from the first clock signal terminal CLKA is transmitted to the second node N2, and thus the sixth transistor T6 is turned off. Further, the first node N1 is at a low level, so that the tenth transistor T10 is completely turned on, and thereby the low level second voltage signal from the second voltage signal terminal VGL is transmitted to the output terminal OUTPUT through the tenth transistor T10. Further, the first node N1 is at a low level, so that the eighth transistor T8 is turned on, and the high level at the second voltage signal terminal VGH is transmitted to the third node N3, and thus the third node N3 is still at a high level.

In addition, periods after the same frame may be repeated in the same manner as that in the previous periods, and details thereof will not be described in detail herein again.

The input terminal INPUT is maintained at a high level in the periods t3, t4, and t5 as described above. In other words, in the embodiment of the present disclosure, duration in which the output signal at the output terminal OUTPUT is maintained at a high level is also increased or decreased accordingly by increasing or decreasing duration in which the input terminal INPUT is at a high level, so as to control, for example, duration in which an OLED pixel is turned on within one frame, thereby controlling display brightness. For example, the duration in which the input terminal INPUT is at a high level within one frame may be set to be longer, for example, to be four times or more of a half of a period of a clock signal, thereby reducing sensitivity of human eyes to a change in brightness.

As may be seen from FIG. 4, for the shift register 200 shown in FIG. 2, in the periods t4 and t6, the first node N1 is at a high level, and the fourth transistor T4 is turned off. At this time, the first clock signal terminal CLKA is at a high level, and the second node N2 becomes an ultra-low level due to the bootstrap action of the second capacitor C2 (as indicated by the dashed box in FIG. 4B). In this case, a source-drain voltage ($V_{DS}$) of the fourth transistor T4 is at an ultra-low level and a gate-source voltage ($V_{GS}$) of the fourth transistor T4 is 0. At this time, current flowing through the fourth transistor T4 is increased, resulting in current leakage between the first clock signal terminal CLKA and the second node N2, thereby increasing power consumption of the circuit. Similarly, in the periods t2, t8, t10, t12 . . . , the first node N1 is at an ultra-low level under the bootstrap action of the first capacitor C1 (as indicated by the dashed box in FIG. 4B), which also results in current leakage between a source and a drain (or a first terminal and a second terminal) of the first transistor T1, thereby increasing the power consumption of the circuit. Similarly, in the periods t7, t8, t9 . . . of FIG. 4, the output terminal OUTPUT is at a low level, and a source and a drain (or a first terminal and a second terminal) of the ninth transistor T9 have a large voltage difference, which also results in current leakage between a source and the source (or the first terminal and the second terminal) of the ninth transistor T9, thereby increasing the power consumption of the circuit.

In order to at least partially solve or alleviate the problem, the embodiments of the present disclosure propose to add a de-noising circuit in the shift register, wherein the de-noising circuit is coupled to at least one of the first node N1, the second node N2, or the output terminal OUTPUT, so as to reduce noise generated at the at least one of the first node N1, the second node N2, or the output terminal OUTPUT which is coupled to the de-noising circuit due to, for example, current leakage of the above transistors. This will be described in detail below with reference to FIGS. 5A to 5D.

Figure 5A:
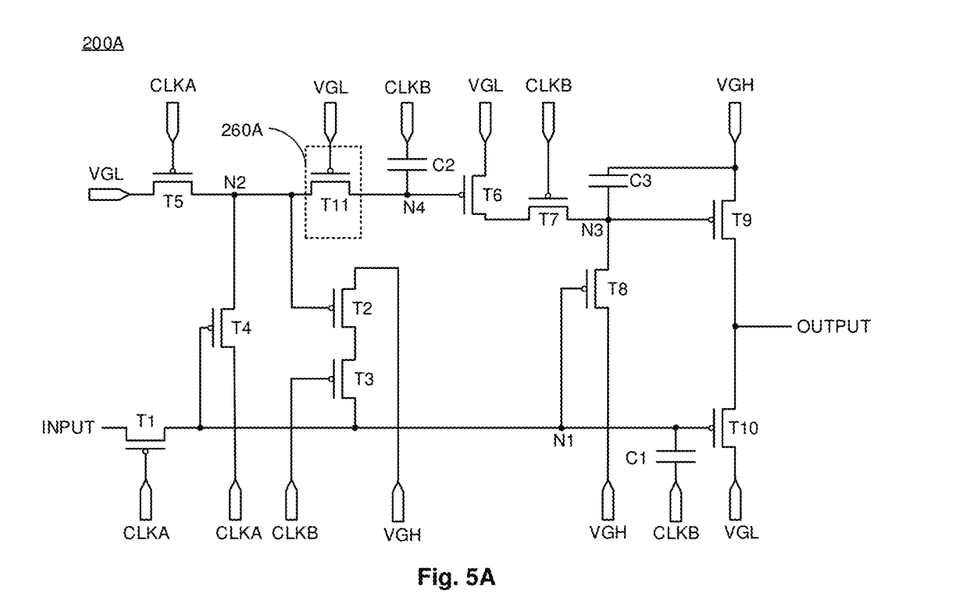
FIG. 5A is an exemplary circuit diagram illustrating a shift register according to another embodiment of the present disclosure.

FIG. 5A is an exemplary circuit diagram illustrating a shift register 200A according to another embodiment of the present disclosure. As shown in FIG. 5A, the shift register 200A is similar to the shift register 200 shown in FIG. 2, except at least that a de-noising circuit 260A is added in the shift register 200A. For the sake of brevity, portions different from those in the embodiment shown in FIG. 2 will be mainly described below.

As shown in FIG. 5A, the de-noising circuit 260A is added at the second node N2. The second capacitor C2 and the sixth transistor T6 are coupled to the second node N2 through the de-noising circuit 260A which may reduce noise at the second node N2. In FIG. 5A, the de-noising circuit 260A comprises an eleventh transistor T11, through which the second terminal of the second capacitor C2 and the control terminal of the sixth transistor T6 are coupled to the second node N2. As shown in FIG. 5A, the eleventh transistor T11 has a control terminal coupled to the second voltage signal terminal VGL, a first terminal coupled to the second node N2, and a second terminal coupled to the control terminal of the sixth transistor T6 and the second terminal of the capacitor C2.

The eleventh transistor T11 is added at the second node N2, so that when the fourth node N4 (i.e., the node coupled to the second terminal of the second capacitor C2 and the control terminal of the sixth transistor T6) is at an ultra-low level, since the control terminal of the eleventh transistor T11 is at a low level, the level at the second node N2 is a low level (which is not an ultra-low level). Thereby, a source and a drain (or a first terminal and a second terminal) of the fourth transistor T4 have a reduced voltage difference, which will not result in current leakage of the fourth transistor T4, thereby reducing the power consumption of the circuit.

Figure 5B:
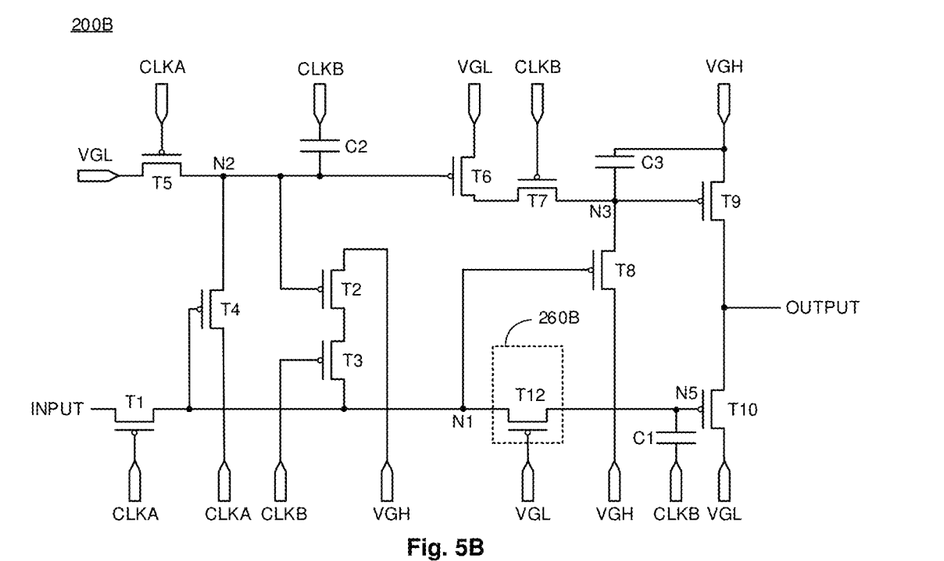
FIG. 5B is an exemplary circuit diagram illustrating a shift register according to another embodiment of the present disclosure.

FIG. 5B is an exemplary circuit diagram illustrating a shift register 200B according to another embodiment of the present disclosure. As shown in FIG. 5B, the shift register 200B is similar to the shift register 200 shown in FIG. 2, except at least that a de-noising circuit 260B is added in the shift register 200B. For the sake of brevity, portions different from those in the embodiment shown in FIG. 2 will be mainly described below.

As shown in FIG. 5B, the de-noising circuit 260B is added at the third node N3. The first capacitor C2 and the tenth transistor T10 are coupled to the third node N3 through the de-noising circuit 260B, and the de-noising circuit 260B may reduce noise at the third node N3. In FIG. 5B, the de-noising circuit 260B comprises a twelfth transistor T12, through which the first terminal of the first capacitor C1 and the control terminal (i.e., the fifth node N5) of the tenth transistor T10 are coupled to the first node N1. As shown in FIG. 5B, the twelfth transistor T12 has a control terminal coupled to the second voltage signal terminal VGL, a first terminal coupled to the first node N1, and a second terminal coupled to the fifth node N5.

The twelfth transistor T12 is added at the first node N1, so that when the fifth node N5 (i.e., the first terminal of the first capacitor C1 and the control terminal of the tenth transistor T10) is at an ultra-low level, since the control terminal of the second transistor T12 is at a low level, the first node N1 is at a low level (which is not an ultra-low level). Thereby, a source and a drain (or a first terminal and a second terminal) of the first transistor T1 have a reduced voltage difference, which will not result in current leakage of the first transistor T1, thereby reducing the power consumption of the circuit and improving stability of the circuit.

Figure 5C:
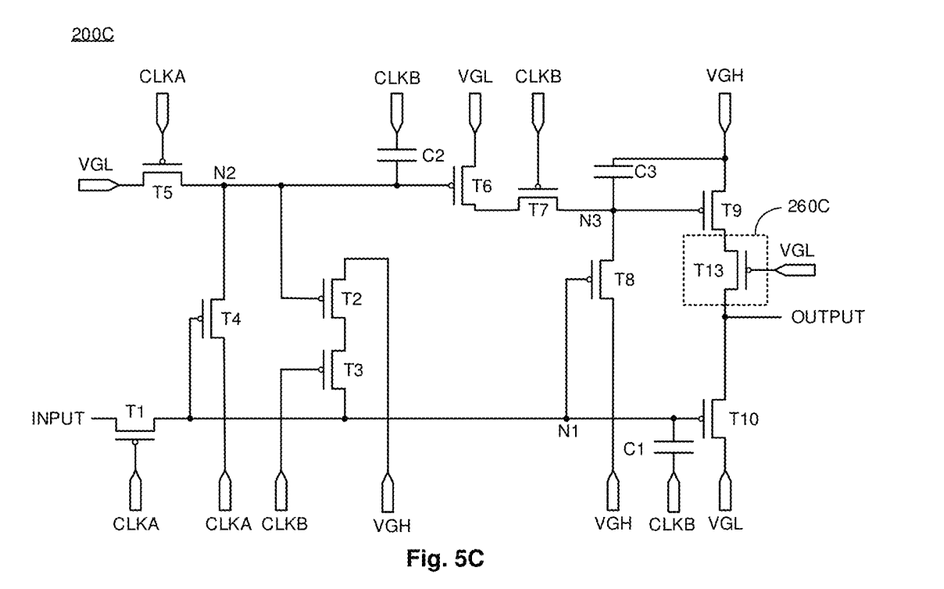
FIG. 5C is an exemplary circuit diagram illustrating a shift register according to yet another embodiment of the present disclosure.

FIG. 5C is an exemplary circuit diagram illustrating a shift register 200C according to yet another embodiment of the present disclosure. As shown in FIG. 5C, the shift register 200C is similar to the shift register 200 shown in FIG. 2, except at least that a de-noising circuit 260C is added in the shift register 200C. For the sake of brevity, portions different from those in the embodiment shown in FIG. 2 will be mainly described below.

As shown in FIG. 5C, the de-noising circuit 260C is added at the output terminal OUTPUT. The second terminal of the ninth transistor T9 is coupled to the output terminal OUT through the de-noising circuit 260C, and the de-noising circuit 260C may reduce noise at the output terminal OUT due to, for example, current leakage of the transistor T9. In FIG. 5C, the de-noising circuit 260C comprises a thirteenth transistor T13, having a control terminal coupled to the second voltage signal terminal VGL, a first terminal coupled to the second terminal of the ninth transistor T9, and a second terminal coupled to the output terminal OUTPUT.

The thirteenth transistor T13 is added at the output terminal OUTPUT, so that the low level at the second terminal of the ninth transistor T9 may increase, which results in that the voltage difference between the source and the drain (or the first terminal and the second terminal) of the ninth transistor T9 is reduced to an extent that no current leakage occurs in the ninth transistor T9, thereby reducing the power consumption of the circuit and improving the stability of the circuit.

In addition, since the above embodiments shown in FIGS. 5A to 5C are designs which are independent of each other, in other words, the eleventh transistor T11, the twelfth transistor T12, and the thirteenth transistor T13 are independent of each other, one, two or three of the three transistors may be selected to form other embodiments.

Figure 5D:
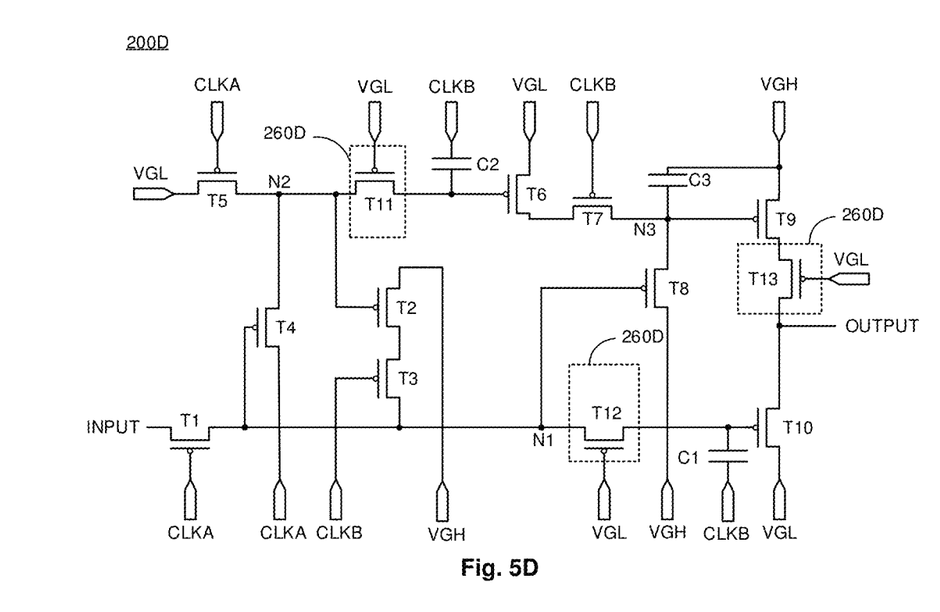
FIG. 5D is an exemplary circuit diagram illustrating a shift register according to a further embodiment of the present disclosure.

FIG. 5D illustrates an exemplary circuit diagram of a shift register 200D according to a further embodiment of the present disclosure. As shown in FIG. 5D, the shift register 200D is similar to the shift register 200 shown in FIG. 2, except at least that a de-noising circuit 260D is added in the shift register 200D as compared with the shift register 200. In FIG. 5D, the de-noising circuit 260D comprises an eleventh transistor T11, a twelfth transistor T12, and a thirteenth transistor T13. Since the three transistors have substantially the same functions as those previously described in connection with FIGS. 5A to 5C, the three transistors will not be described in detail herein again for the sake of clarity and brevity. It should be illustrated that the registers 200A to 200D in FIGS. 5A to 5D etc. may also be applied to the design of the gate driving circuit shown in FIG. 3.

Figure 6:
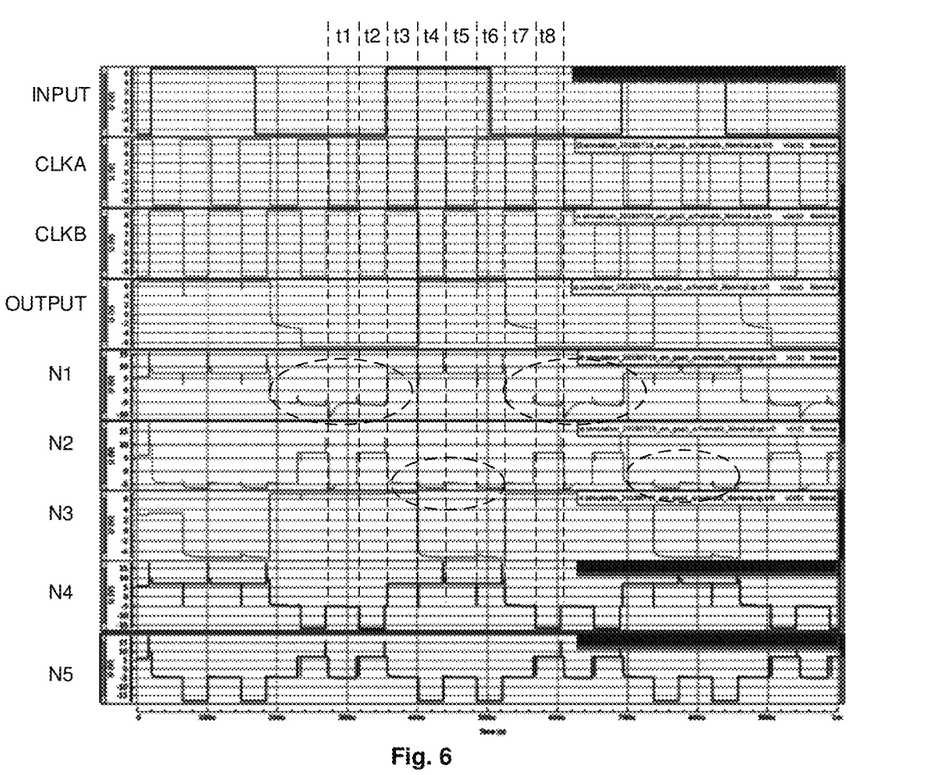
FIG. 6 is a waveform diagram illustrating simulation signals of the shift register shown in FIG. 5D.

FIG. 6 is a waveform diagram illustrating simulation signals of a shift register in which a de-noising circuit is added, according to an embodiment of the present disclosure. As may be seen from FIG. 6, since the eleventh transistor T11 and the twelfth transistor T12 are used to change the ultra-low levels at the second node N2 and the first node N1 to low levels, in fact, a working principle of the shift register 200 is substantially not changed, and therefore a workflow here is substantially the same as that shown in FIG. 4, and will not be described in detail herein again.

As may be seen from comparison between the dotted ellipse portions for the first node N1 and the second node N2 in FIGS. 4B and 6, in FIG. 4b, the lowest point of the first node N1 is about −15V, and the lowest level of the second node N2 is at about −10V; while in FIG. 6, the lowest level of the first node N1 is at about −5V (and −10V in a very short time), and the lowest level of the second node N2 is at about −5V.

Therefore, as may be seen from comparison between timing diagrams in FIG. 4B and FIG. 6, with, for example, the designs of the eleventh transistor T11 in FIG. 5A and the twelfth transistor T12 in FIG. 5B, ultra-low voltages at the node N2 and the first node N1 may be avoided accordingly, which avoids the current leakage phenomenon of the fourth transistor T4 and the first transistor T1, thereby effectively reducing the power consumption. Similarly, with, for example, the design of the thirteenth transistor T13 in FIG. 5C, an ultra-low voltage at the ninth transistor T9 may be avoided accordingly, which avoids the current leakage phenomenon of the ninth transistor T9, thereby effectively reducing the power consumption. Further, beneficial effects may be generated using any combination of the three transistors T11, T12 and/or T13 described above or using the transistor T11, T12 or T13 separately. In other words, with the designs of the shift registers described above, the display brightness of the OLED may be effectively controlled, the requirements on the IC may be reduced, and the applicability of the OLED display may be improved.

Hereinafter, a method for driving a shift register according to an embodiment of the present disclosure will be described in detail with reference to FIG. 7.

Figure 7:
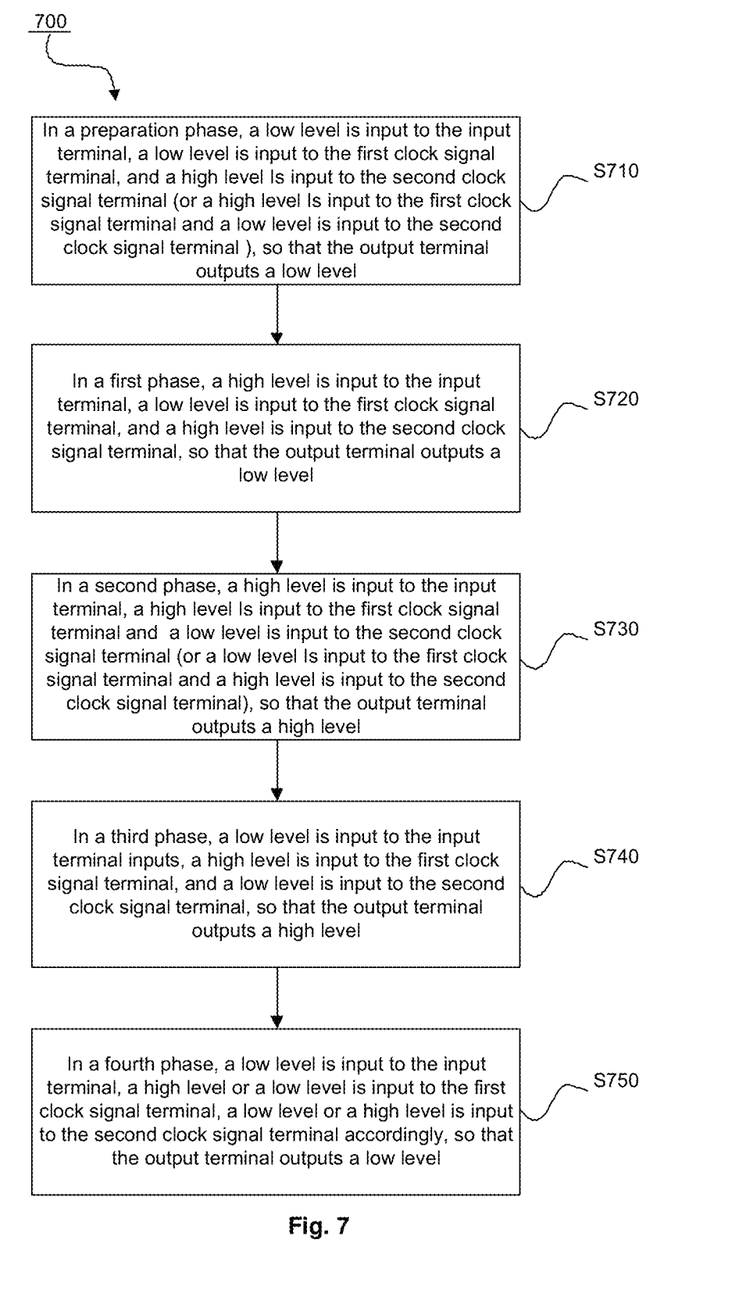
FIG. 7 is a flowchart illustrating an exemplary method for driving a shift register according to an embodiment of the present disclosure.

FIG. 7 is a flowchart illustrating an exemplary method 700 for driving a shift register according to an embodiment of the present disclosure. As shown in FIG. 7, the method 700 may comprise steps S710, S720, S730, S740, and S750.

According to the present disclosure, some of the steps of the method 700 may be performed separately or in combination, and may be performed in parallel or sequentially, and the present disclosure is not limited to a specific operation order illustrated in FIG. 7. In some embodiments, the method 700 may be performed by each of the shift registers described above or another external device.

The method 700 may start at step S710. In step S710, in a preparation phase, a low level is input to the input terminal, a low level is input to the first clock signal terminal, and a high level is input to the second clock signal terminal (or a high level is input to the first clock signal terminal and a low level is input to the second clock signal terminal), so that the output terminal outputs a low level. This step may include the periods t1 and t2 shown in FIG. 4.

In step S720, in a first phase, a high level is input to the input terminal, a low level is input to the first clock signal terminal, and a high level is input to the second clock signal terminal, so that the output terminal outputs a low level. This step may include the period t3 shown in FIG. 4.

In step S730, in a second phase, a high level is input to the input terminal, a high level is input to the first clock signal terminal, and a low level is input to the second clock signal terminal (or a low level is input to the first clock signal terminal and a high level is input to the second clock signal terminal), so that the output terminal outputs a high level. This step may include the periods t4 and t5 shown in FIG. 4.

In step S740, in a third phase, a low level is input to the input terminal, a high level is input to the first clock signal terminal inputs, and a low level is input to the second clock signal terminal inputs, so that the output terminal outputs a high level. This step may include the period t6 shown in FIG. 4.

In step S750, in a fourth phase, a low level is input to the input terminal, a high level or a low level is input to the first clock signal terminal inputs, and a low level or a high level is input to the second clock signal terminal accordingly, so that the output terminal outputs a low level. This step may include the periods t7 and t8 shown in FIG. 4.

With the driving method as described above, the duration in which the output signal at the output terminal OUTPUT is at a high level may be increased or decreased accordingly by increasing or decreasing the duration (for example, t3, t4, t5, etc.) in which the input terminal INPUT is at a high level, which thus may control the duration in which an OLED is turned on within one frame, so as to control the display brightness. Similarly, the duration in which the input terminal INPUT is at a high level within one frame may be set to be longer, for example, to be five times of a half of a period of a clock signal, thereby reducing sensitivity of human eyes to a change in brightness.

Further, the de-noising circuit (for example, at least one of the eleventh transistor T11, the twelfth transistor T12, or the thirteenth transistor T13) is provided, which may eliminate or reduce noise at a node in the shift register due to current leakage of transistors.

The embodiments of the present disclosure further provide a display apparatus, comprising the gate driving circuit described above. In some embodiments, the display apparatus may further comprise a display panel on which pixel units arranged in an array are provided, and a driving signal generated by the gate driving circuit is used to drive a respective pixel unit for display. However, it should be apparent to those skilled in the art that the embodiments of the present disclosure are not limited thereto. Examples of the display apparatus comprise, but not limited to, devices having display functions such as mobile phones, tablets, televisions, desktops, notebook computers, etc.

The present disclosure has thus far been described in connection with embodiments. It is to be understood that various other changes, substitutions and additions can be made by those skilled in the art without departing from the spirit and scope of the present disclosure. Accordingly, the scope of the present disclosure is not limited to the specific embodiments described above, but should be defined by the appended claims.

In addition, functions described herein as being implemented by hardware, software and/or firmware can also be implemented by means of dedicated hardware, a combination of general purpose hardware and software, etc. For example, functions described as being implemented by dedicated hardware (for example, a Field Programmable Gate Array (FPGA), an Application Specific Integrated Circuit (ASIC), etc.) can be implemented by general purpose hardware (for example, a Central Processing Unit (CPU), a Digital Signal Processor (DSP)) in combination with software, and vice versa.

We claim:

1. A shift register, comprising:
an input circuit coupled to a first clock signal terminal, an input terminal, and a first node, and configured to transmit an input signal from the input terminal to the first node under control of a first clock signal from the first clock signal terminal;
a first node control circuit coupled to the first node, a second clock signal terminal, a first voltage signal terminal, and a second node, and configured to transmit a first voltage signal from the first voltage signal terminal to the first node under control of a potential at the second node and a second clock signal from the second clock signal terminal;
a second node control circuit coupled to the first clock signal terminal, the first node, and the second node, and configured to transmit the first clock signal from the first clock signal terminal to the second node under control of a potential at the first node;
a third node control circuit coupled to the second node, the first clock signal terminal, the second clock signal terminal, a second voltage signal terminal, and a third node, and configured to transmit the second voltage signal from the second voltage signal terminal to the third node under control of the first clock signal from the first clock signal terminal, the second clock signal from the second clock signal terminal, and the potential at the second node;
an output circuit coupled to the first node, the third node, the first voltage signal terminal, the second voltage signal terminal, the second clock signal terminal, and an output terminal, and configured to transmit the first voltage signal from the first voltage signal terminal or the second voltage signal from the second voltage signal terminal to the output terminal under control of the potential at the first node, a potential at the third node, and the second clock signal from the second clock signal terminal; and
a de-noising circuit coupled to at least one of the first node, the second node, or the output terminal, and configured to reduce noise at the at least one of the first node, the second node, or the output terminal, which is coupled to the de-noising circuit,
wherein the third node control circuit comprises:
a fifth transistor having a control terminal coupled to the first clock signal terminal, a first terminal coupled to the second voltage signal terminal, and a second terminal coupled to the second node;
a sixth transistor having a control terminal coupled to the second node, a first terminal coupled to the second voltage signal terminal, and a second terminal coupled to a first terminal of a seventh transistor;
the seventh transistor having a control terminal coupled to the second clock signal terminal, the first terminal coupled to the second terminal of the sixth transistor, and a second terminal coupled to the third node; and
a second capacitor having a first terminal coupled to the second clock signal terminal and a second terminal coupled to the second node,
wherein the output circuit comprises:
a first output sub-circuit coupled to the first node, the third node, the first voltage signal terminal, and the output terminal, and configured to transmit the first voltage signal from the first voltage signal terminal to the output terminal under control of the potential at the first node and the potential at the third node; and
a second output sub-circuit coupled to the first node, the second voltage signal terminal, the second clock signal terminal, and the output terminal, and configured to transmit the second voltage signal from the second voltage signal terminal to the output terminal under control of the potential at the first node and the second clock signal from the second clock signal terminal,
wherein the first output sub-circuit comprises:
an eighth transistor having a control terminal coupled to the first node, a first terminal coupled to the first voltage signal terminal, and a second terminal coupled to the third node;
a ninth transistor having a control terminal coupled to the third node, a first terminal coupled to the first voltage signal terminal, and a second terminal coupled to the output terminal; and
a third capacitor having a first terminal coupled to the first voltage signal terminal and a second terminal coupled to the third node,
wherein the second output sub-circuit comprises:
a tenth transistor having a control terminal coupled to the first node, a first terminal coupled to the second voltage signal terminal, and a second terminal coupled to the output terminal; and
a first capacitor having a first terminal coupled to the first node, and a second terminal coupled to the second clock signal terminal, and
wherein the de-noising circuit comprises:
an eleventh transistor through which the control terminal of the sixth transistor and the second terminal of the second capacitor are coupled to the second node, wherein the eleventh transistor has a control terminal coupled to the second voltage signal terminal, a first terminal coupled to the second node, and a second terminal coupled to the control terminal of the sixth transistor and the second terminal of the second capacitor;
a twelfth transistor through which the first terminal of the first capacitor and the control terminal of the tenth transistor are coupled to the first node, wherein the twelfth transistor has a control terminal coupled to the second voltage signal terminal, a first terminal coupled to the first node, and a second terminal coupled to the first terminal of the first capacitor and the control terminal of the tenth transistor; and a thirteenth transistor through which the second terminal of the ninth transistor is coupled to the output terminal, wherein the thirteenth transistor has a control terminal coupled to the second voltage signal terminal, a first terminal coupled to the second terminal of the ninth transistor, and a second terminal coupled to the output terminal.

2. The shift register according to claim 1, wherein the first node control circuit comprises:
- a second transistor having a control terminal coupled to the second node, a first terminal coupled to the first voltage signal terminal, and a second terminal coupled to a first terminal of a third transistor; and
- the third transistor having a control terminal coupled to the second clock signal terminal, the first terminal coupled to the second terminal of the second transistor, and a second terminal coupled to the first node.

3. The shift register according to claim 1, wherein the second node control circuit comprises:
- a fourth transistor having a control terminal coupled to the first node, a first terminal coupled to the first clock signal terminal, and a second terminal coupled to the second node.

4. The shift register according to claim 1, wherein the input circuit comprises:
- a first transistor having a control terminal coupled to the first clock signal terminal, a first terminal coupled to the input terminal, and a second terminal coupled to the first node.

5. The shift register according to claim 1, wherein transistors in the shift register are all P-type transistors, the first voltage signal is a high level signal and the second voltage signal is low level signal.

6. A gate driving circuit, comprising a plurality of cascaded shift registers according to claim 1.

7. A display apparatus, comprising the gate driving circuit according to claim 6.

8. A method for driving the shift register according to claim 1, comprising:
- in a preparation phase, inputting a low level to the input terminal, inputting one of a low level or a high level to the first clock signal terminal, and inputting the other of the low level or the high level to the second clock signal terminal, so that the output terminal outputs a low level;
- in a first phase, inputting a high level to the input terminal, inputting a low level to the first clock signal terminal, and inputting a high level to the second clock signal terminal, so that the output terminal outputs a low level;
- in a second phase, inputting a high level to the input terminal, inputting one of a low level or a high level to the first clock signal terminal, and inputting the other of the low level or the high level to the second clock signal terminal, so that the output terminal outputs a high level;
- in a third phase, inputting a low level to the input terminal, inputting a high level to the first clock signal terminal, and inputting a low level to the second clock signal terminal, so that the output terminal outputs a high level; and
- in a fourth phase, inputting a low level to the input terminal, inputting a high level to the first clock signal terminal, and inputting a low level to the second clock signal terminal, so that the output terminal outputs a low level.

* * * * *